United States Patent [19]

Matsuoka

[11] Patent Number: 5,458,499
[45] Date of Patent: Oct. 17, 1995

[54] IC SOCKET

[75] Inventor: Noriyuki Matsuoka, Yokohama, Japan

[73] Assignee: Yamaichi Electronics Co., Ltd., Tokyo, Japan

[21] Appl. No.: 173,062

[22] Filed: Dec. 27, 1993

[30] Foreign Application Priority Data

Dec. 26, 1992 [JP] Japan .................................. 4-359081

[51] Int. Cl.⁶ ............................................. H01R 11/22
[52] U.S. Cl. ........................................... 439/266; 439/331
[58] Field of Search ........................ 439/68, 14 73, 439/259–269, 330, 331

[56] References Cited

U.S. PATENT DOCUMENTS

| | | | |
|---|---|---|---|
| 4,031,295 | 6/1977 | Rigazio | 429/100 |
| 4,498,047 | 2/1985 | Hexamer et al. | 324/158 F |
| 4,623,208 | 11/1986 | Kerul et al. | 439/266 |
| 4,669,796 | 6/1987 | Carter | 439/372 |
| 4,832,610 | 5/1989 | Matsuoka | 439/68 |
| 4,846,703 | 7/1989 | Matsuoka et al. | 439/266 |
| 4,846,704 | 7/1989 | Ikeya | 439/72 |
| 4,886,470 | 12/1989 | Billman et al. | 439/266 |
| 5,076,796 | 12/1991 | Uratsuji | 439/266 |
| 5,186,641 | 2/1993 | Uratsuji | 439/266 |
| 5,195,903 | 3/1993 | Uratsuji | 439/266 |
| 5,290,192 | 3/1994 | Espenshade et al. | 439/266 |
| 5,304,072 | 4/1994 | Kunioka et al. | 439/266 |

FOREIGN PATENT DOCUMENTS 4-154065  5/1982  Japan .
2119173 11/1983  United Kingdom .

Primary Examiner—Gary F. Paumen
Assistant Examiner—Hien D. Vu
Attorney, Agent, or Firm—Wenderoth, Lind & Ponack

[57] ABSTRACT

An IC socket comprises an IC package receiving portion, a plurality of contact members arranged along the IC package receiving portion, and a contact shutter member for displacing the contact members between a contacting position relative to leads of the IC package and a releasing position. A positioning member is provided for restricting a body or the leads of the IC package by being operatively in connection with the contact shutter member. The positioning member is arranged such that a positioning operation thereof is made at the same time with or prior to the electrical contact between the contact members and the leads.

11 Claims, 9 Drawing Sheets

IC SOCKET

BACKGROUND OF THE INVENTION

1. Field of the Invention

This invention relates to an IC socket in which contact members are displaced by a contact shutter member so that the electrical contact is established or broken between the contact members and leads of an IC package, and more particularly to an IC package positioning mechanism for use in the IC socket.

2. Brief Description of the Prior Art

There is known an IC socket as disclosed, for example, in an official gazette of Japanese Early Laid-Open Patent Application No. Hei 4-154065, in which an IC package is put into an IC package receiving portion from above and the electrical contact for each of the contact members with leads of the IC package is established and broken by a contact shutter member.

However, the above conventional IC socket has the following shortcomings. When the IC package is dropped so as to be received in the IC package receiving portion, the IC package tends to rebound in the IC receiving portion with the result that the leads of the IC package are positionally displaced relative to the corresponding contact members to cause poor electrical contact between the contact members and the leads.

SUMMARY OF THE INVENTION

It is therefore an object of the present invention to provide an IC socket, in which contact members are operatively connected to a contact shutter member to correctly position an IC package before the contact members come into electrical contact with leads of an IC package, so that the contact members may be brought into contact with the leads properly.

In order to achieve the above object, according to the present invention, there is essentially provided an IC socket comprising an IC package receiving portion, a plurality of contact members arranged along the IC package receiving portion, and a contact shutter member for displacing the contact members between a contacting position relative to leads of the IC package and a releasing position. In addition a positioning member is provided for restricting a body or the leads of the IC package by being operatively in connection with the contact shutter member. The positioning member is arranged such that a positioning operation thereof is made at the same time with or prior to the electrical contact between the contact members and the leads.

BRIEF DESCRIPTION OF THE DRAWINGS

FIGS. 4(A)–4(C) are also cross-sectional views taken along line A—A of FIG. 1, but FIG. 4(A) shows a state in which an IC package has been received in an IC receiving portion, FIG. 4(B) shows a state in which a positioning member is positioning a lead of the IC package, and FIG. 4(C) shows a state in which a contact member is in contact with the lead of the IC package;

DETAILED DESCRIPTION OF THE EMBODIMENTS

FIGS. 1 to 8 illustrates an IC socket according to a first embodiment of the present invention.

Figure 1:
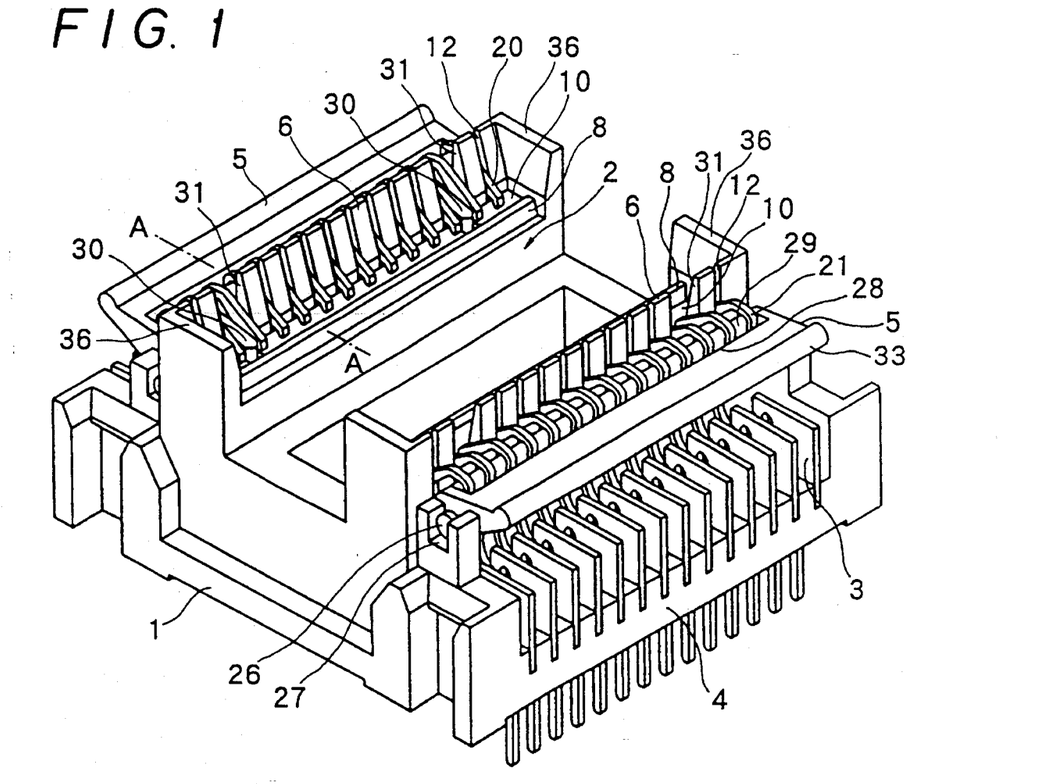
FIG. 1 is a perspective view of an IC socket according to a first embodiment of the present invention.
Figure 4:
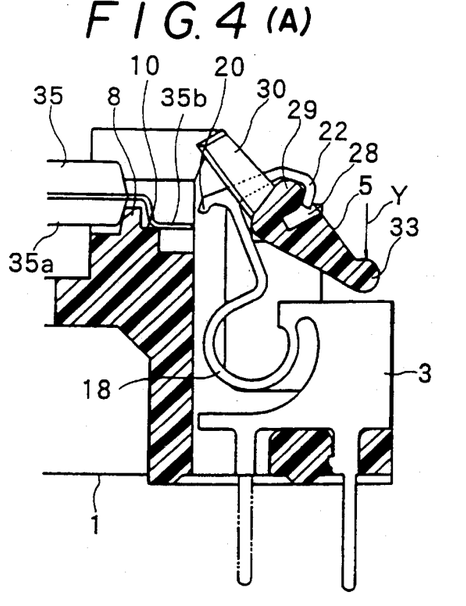
Figure 5:
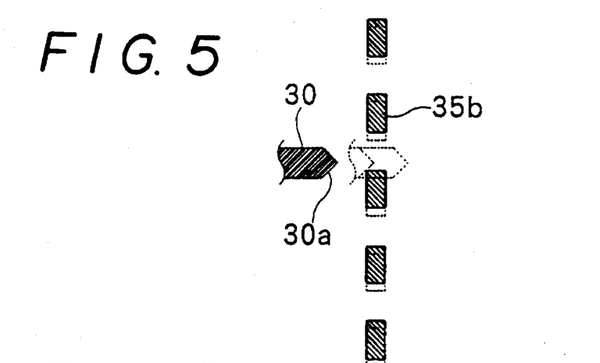
FIG. 5 is a cross-sectional view for explaining the positioning action of the positioning member according to the first embodiment of the present invention.

In FIG. 1, a socket body 1 molded from electrically insulating material is provided at a central portion thereof with a generally square IC receiving portion 2 which is opened upwardly and capable of receiving therein an IC package 35 as shown in FIG. 4. A plurality of contact members 3 are arranged in array on the socket body 1 along at least one pair of opposite sides of the IC receiving portion 2 in such a manner as to correspond to leads 35b of the IC package 35. The socket body 1 is equipped with a contact shutter member capable of displacing the contact members 3 between a contacting position where the contact members 3 are in contact with the leads 35b of the IC package 35 which has already been received in the IC receiving portion 2 and a releasing position. In this embodiment, contact shutter levers 5, which act as the contact shutter member, are turnably supported by the socket body 1.

The IC receiving portion 2 is provided at an inner side of each array of the contact members 3 with a rib 8 lying in parallel relation to the array of the contact members. As shown in FIG. 4(B), the rib 8 is adapted to restrict that side surface of the IC package 35a from which the lead 35b projects sidewardly. A foremost end of the lead 35b, which is bent in two steps to provide a crab-leg like configuration, is rested on a lead support surface 10 which is formed on a location outside the rib 8. A plurality of contact partition walls 6 are formed outside the support surface 10 in such a manner as to be in parallel relation to the array of the contact members 3. A contacting portion 20, as well as the portions therearound, of each contact member 3 is disposed in a slit 12 formed between adjacent partition walls 6.

The contact members 3 are arranged in array along the outside of the lead support surfaces 10, i.e, along the outside of the partition walls 6. Each contact 3 has a support plate portion 13 which is supported on an upper surface of a contact implanting portion 4. For implanting, a press-in portion 14 projecting downwardly of the support plate portion 13 is press-fitted into a contact press-in hole 15 which is formed in the contact implanting portion 4. A terminal portion 17 projects downwardly from an inner end side or outer end side of the support plate portion 13, and the press-in portion 14 is formed on a basal portion of the terminal portion 17.

The contact member 3 has a curved spring portion 18 projecting inwardly (toward the IC receiving portion 2 side) from an upper part of the support plate portion 13 and having a generally three-quarter arcuate configuration. The contact member 3 further has an arm portion 19 extending linearly and obliquely upwardly while inclining inwardly and forwardly from the upper end of the curved spring portion 18. The upper end of the arm portion 19 extends upwardly to above the level of the lead support surface 10. The contact member 3 further has the contacting portion 20 projecting obliquely downwardly, i.e., toward the lead support surface 10, from the upper end of the arm portion 19. By putting this contacting portion 20, as well as the portions of the contact member 3 adjacent the contacting portion 20, into the slit 12, the upper end of the contact member 3 is restricted by the partition wall 6. The contact member 3 further has an arm portion 21 extending outwardly and obliquely upwardly from a connection area between the contacting portion 20 and the arm portion 19, and a hook portion 22 bent downwardly from the end portion of the arm 21.

Figure 2:
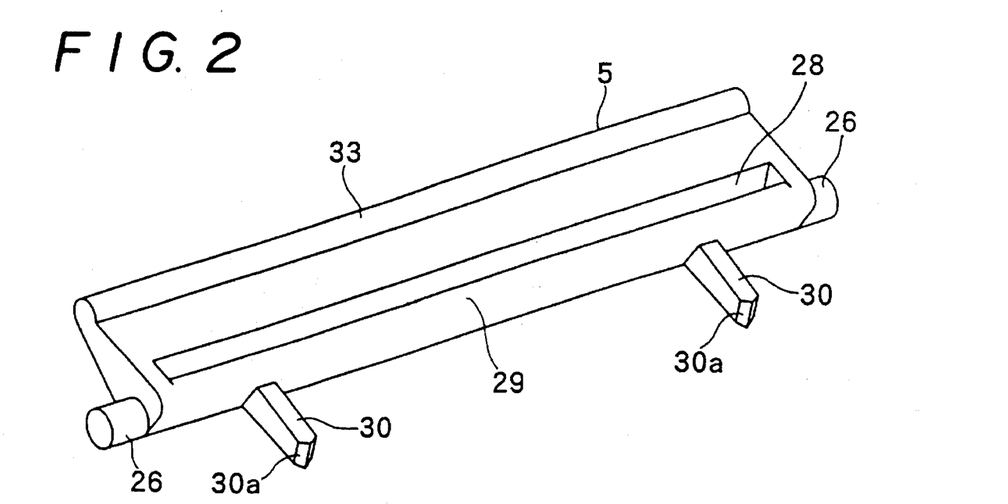
FIG. 2 is a perspective view of a contact shutter lever according to the first embodiment of the present invention.

As shown in FIGS. 1 and 2, the contact shutter levers 5 extend along a pair of opposite sides, i.e., along and in parallel relation to the array of the contact members 3, of the IC receiving portion 2, and are turnably (or pivotally) supported on support shafts 26, respectively, which are, in turn, rotatably supported by bearing portions 27 projecting upwardly from opposite ends of the contact implanting portion 4, and which extend longitudinally of the levers 5 with both ends of the shafts 26 projecting slightly outwardly from opposite ends of the levers 5.

Each of the contact shutter levers 5 has an engagement groove 28 formed in the area in the vicinity of the support shaft 26 and along the array of the contact members 3 and opening upwardly. The lever 5 is provided at an inner end thereof with an operation portion 29 which has an arcuate surface along the engagement groove 28, and at an outer end thereof with a pressure receiving portion 33. The hook portion 22 of the contact member 3 is brought into engagement in engagement groove 28. Owing to the foregoing arrangement, the downward movement of the pressure receiving portion 33 of the lever 5 causes the contacting portion 20 of the contact member 3 to be displaced outwardly and backwardly to realize a contact releasing condition. The inwardly forward displacement of the contact member 3 caused by a restoring force of the spring portion 18 causes the pressure receiving portion 33 of the lever to be turned upwardly in order to bring the foremost end portion of the contacting portion 20 into abutment with the lead support surface 10.

Figure 3A:
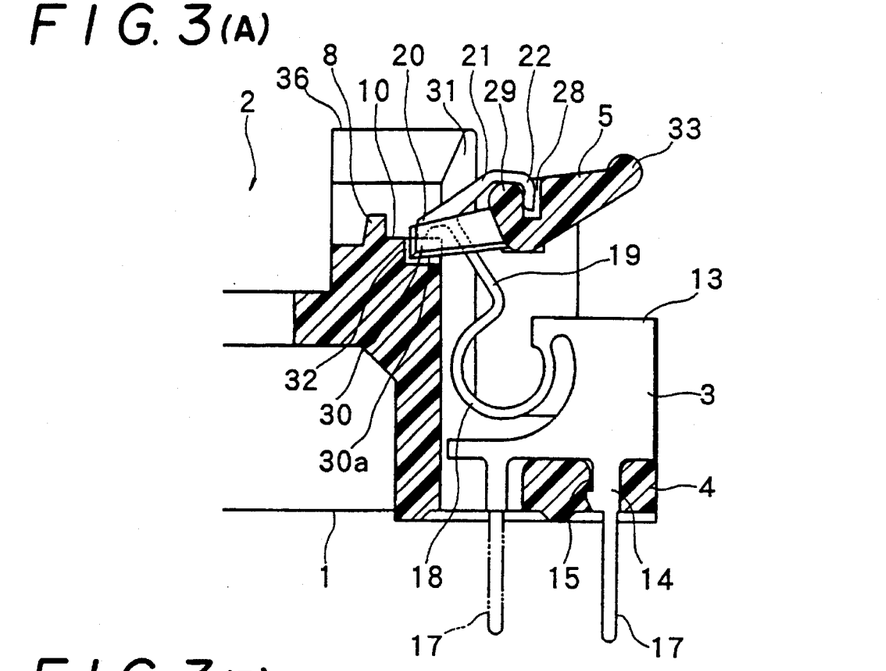
FIGS. 3(A) and 3(B) are cross-sectional views taken on line A—A of FIG. 1, FIG. 3(A) showing a state in which the contact shutter lever has been turned upwardly, and FIG. 3(B) showing a state in which the contact shutter lever has been turned downwardly.
Figure 6:
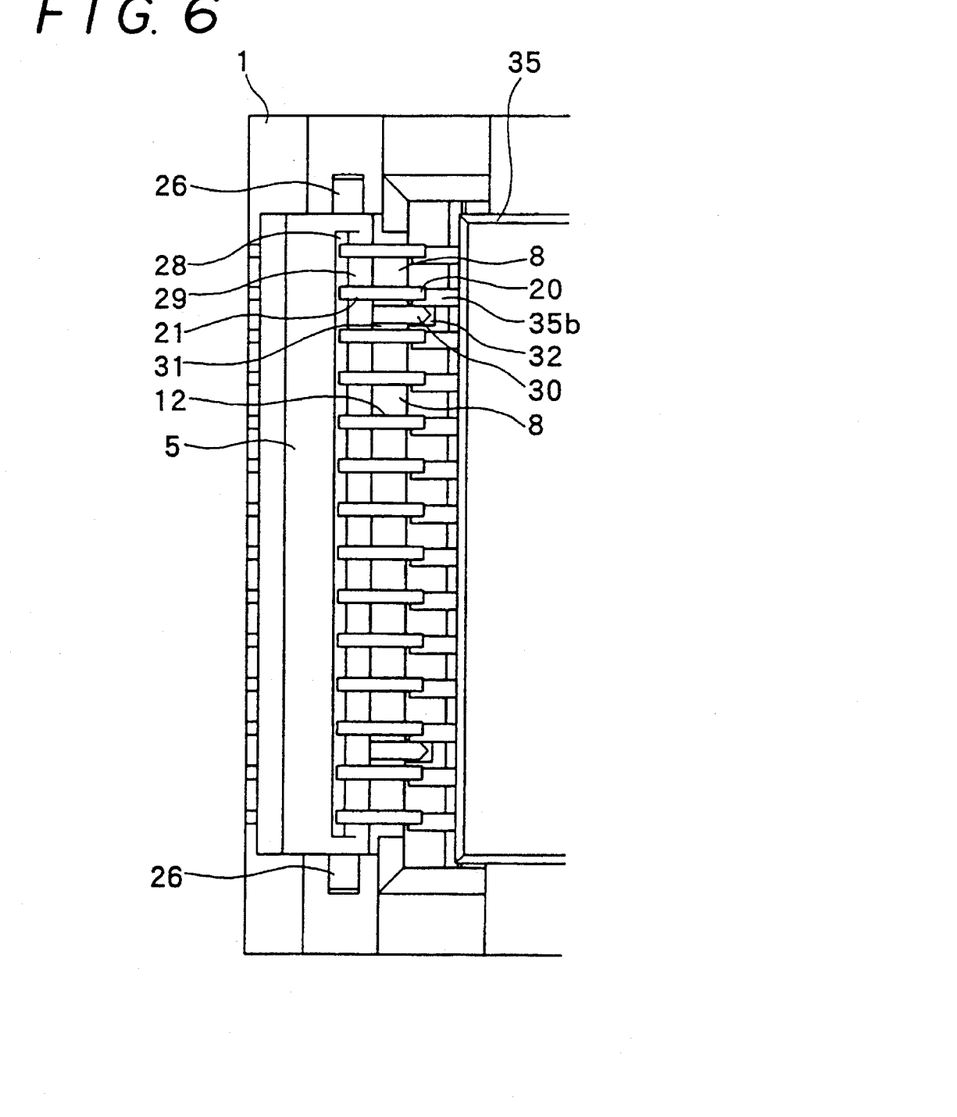
FIG. 6 is a plan view showing a state in which the IC package has been correctly positioned by the positioning member according to the first embodiment of the present invention and as a result, the contact members are in contact with the leads.

The contact shutter lever 5 is provided with knife-like positioning members 30 integrally formed therewith and inwardly projecting between adjacent contact members 3 or through the array of the contact members 3. Each of the positioning members 30, together with the adjacent contact members 3, passes through a wide slot 31 formed between the adjacent partition walls 6. A knife edge 30a, which is formed from a front edge portion of the positioning member 30 to a lower edge portion thereof, is inserted into a recess 32 formed in the lead support surface 10 as shown in FIGS. 3(A) and 6. During this process, the positioning member 30 is interposed between the adjacent leads 35b supported by the lead support surface 10 so that the leads 35b are correctly positioned and at the same time the position of the contacting portion 20 of the contact member 3 relative to the corresponding lead is established.

Figure 3B:
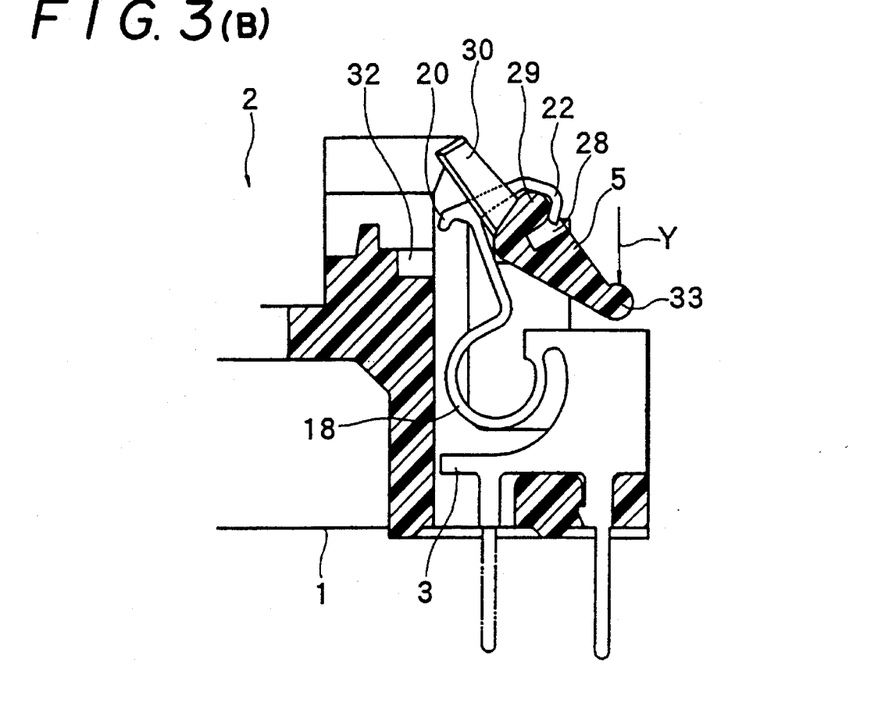

When the contact shutter lever 5 is pressed down against the resiliency of the curved spring portion 18 by applying a press-down force as indicated by an arrow Y of FIG. 3(B) to the pressure receiving portion 33, the positioning member 30 is turned outwardly and obliquely upwardly about the support shaft 26 and the contacting portion 20 of the contact member 3 is also turned outwardly and obliquely upwardly against the curved spring portion 18, so that the positioning member 30 and the contacting portion 20 are displaced to the releasing position so as to standby and not interfere with the IC package 35 being received in the IC receiving portion 2.

According to the above embodiment, when the contact shutter lever 5 is opened against the resiliency of the curved spring portion 18 by applying the press-down force as indicated by the arrow Y of FIG. 4(A) to the pressure receiving portion 33 of the contact shutter member 5, the positioning member 30 is turned outwardly and obliquely upwardly and the hook portion 22 of the contact member 3 is caused to draw the operation portion 29 of the contact shutter lever 5 so that the contacting portion 20 is pulled backwardly and obliquely upwardly so as to be displaced into the releasing position. In that condition, when the IC package 35 is dropped into the IC receiving portion 2, the body 35a of the IC package 35 is disposed between and has the side surfaces thereof restricted by the ribs 8. At the same time, the foremost end of the lead 35b is received on the lead support surface 10 and the IC package 35 is received in the IC receiving portion 2.

Thereafter, when the press-down force to the contact shutter lever 5 is removed, the contact shutter lever 5 is turned upwardly by a restoring resiliency of the curved spring portion 18. During this turning process, as shown in FIG. 4(B), the contacting portion 20 of the contact member 3 is displaced forwardly and obliquely downwardly toward the contacting position from the above-mentioned releasing position, and the positioning member 30 is turned downwardly from the standby position. By doing this, the contacting portion 20 is brought into contact with the foremost end portion of the lead which is placed on the lead support surface 10. Before this, the positioning member 30 is caused to enter between the adjacent leads 35b. That is, during the process in which the positioning member 30 is moved from a position as indicated by a solid line of FIG. 5 to a position indicated by a dotted line, the knife edge 30a is brought into abutment with the edge portion of the lead 35b as indicated by an imaginary line of FIG. 5 and then caused to press the side surfaces of the leads 35b so that the leads 35b are slightly moved from the position as indicated by the solid line to the position as indicated by the dotted line so as to correspond to the contacting portion 20 of the contact member 3. At the same time with this lead positioning operation, or after the completion of this positioning operation, as shown in FIG. 4(C), the positioning member 30 is inserted into the recess 32, and the contacting portion 20 is brought into press contact with the upper surface of the lead 35b by the restoring resiliency of the curved spring portion 18 so that the lead is held between the lead support surface 10 and the contacting portion 20 so as to maintain the contacting condition. When a side surface of at least one lead 35b is pressed by the positioning member 30, as shown in FIG. 6, the IC package 35 is moved laterally in the IC receiving portion 2, so that the positions of the individual leads 35b relative to the contacting portions 20 are established, respectively.

Figure 7:
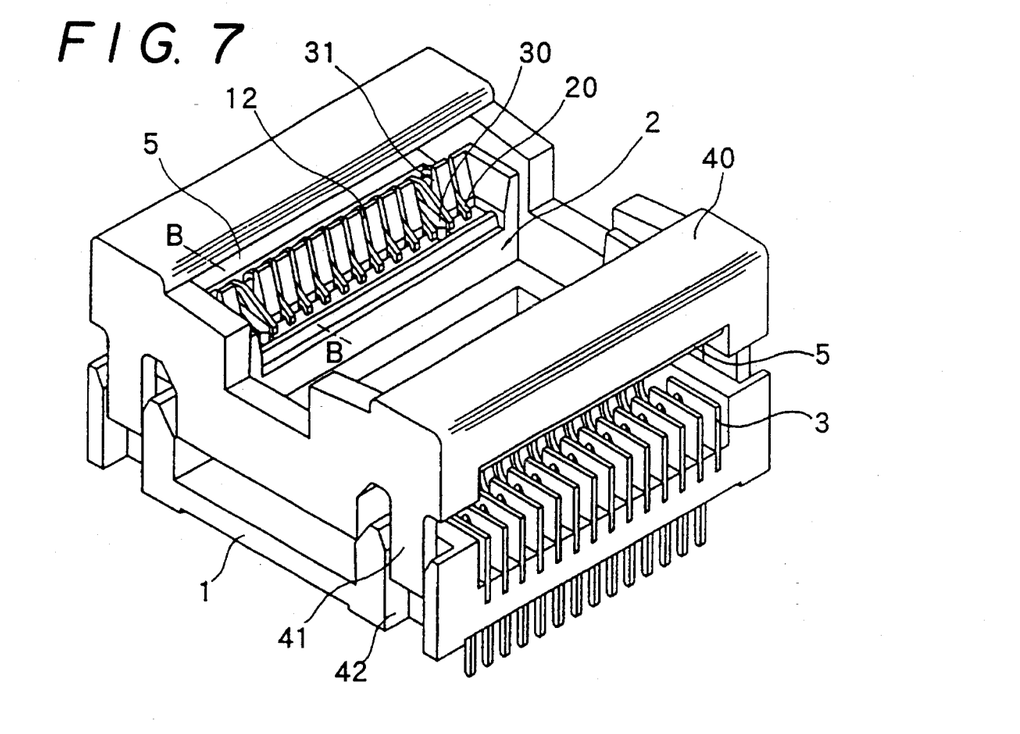
FIG. 7 is a perspective view showing an IC socket provided with a contact shutter cover according to the first embodiment of the present invention.
Figure 8:
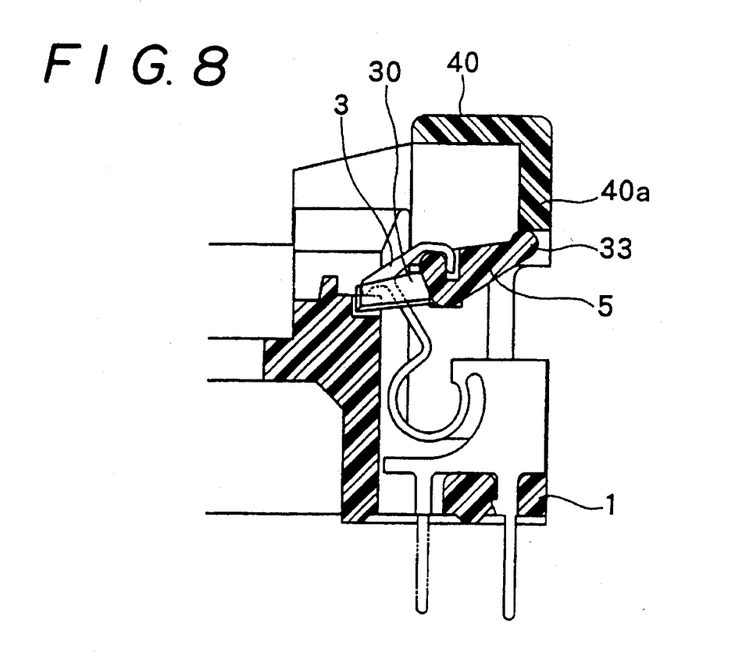
FIG. 8 is a cross-sectional view taken on line B—B of FIG. 7.

The contact shutter lever 5 is directly pressed down by an automatic machine or by hand. As shown in FIGS. 7 and 8, the arrangement may include a contact shutter cover 40 mounted on the socket base 1 for movement upwardly and downwardly through guide portions 41 and 42, and the pressing down of the contact shutter cover 40 directly by an automatic machine or by hand makes it possible to indirectly press down the pressure receiving portion 33 of the contact shutter lever 5 via the press-down portion 40a. The arrangement may also be such that the contact member 3 is opened and closed directly by the contact shutter cover 40 without the need for the contact shutter levers 5.

Figure 9:
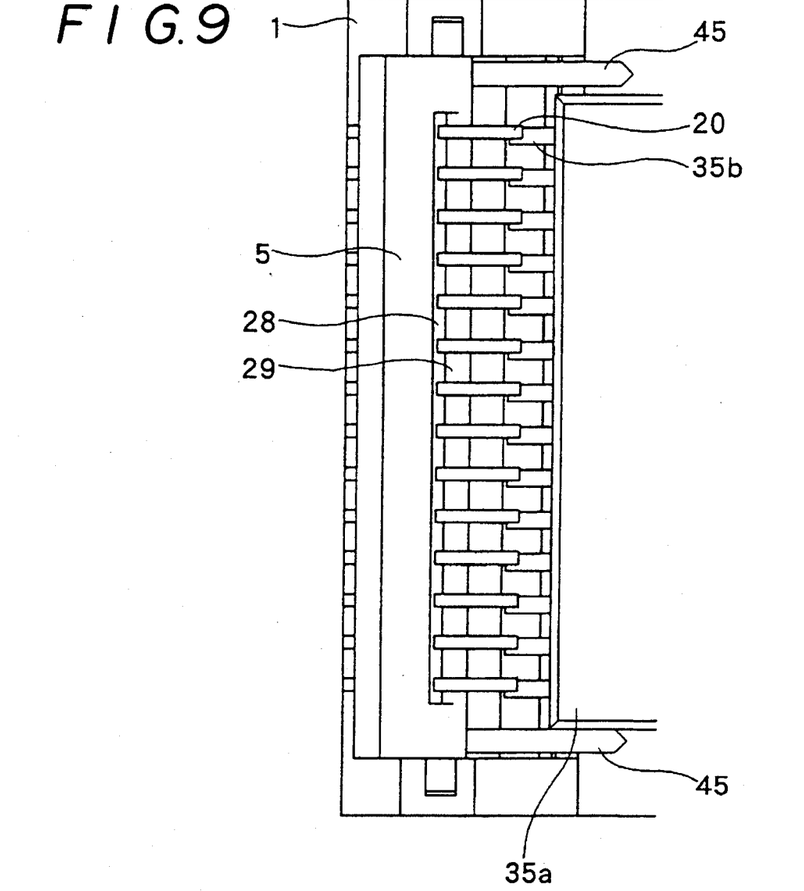
FIG. 9 is a plan view showing an IC socket according to a second embodiment of the present invention.

FIG. 9 shows a second embodiment of the present invention. As illustrated, the contact shutter lever 5 is provided at longitudinally opposite end portions thereof with a pair of positioning members 45 extending toward the opposite side surfaces of the IC package body 35a. In operation, the positioning members 45 are turned by being operatively connected to the contact shutter lever 5, to thereby restrict the opposite side surfaces of the IC package body 35a in order to correctly position the leads 35b relative to the contact members 3 before the contact member 3 are brought into contact with the leads 35b.

That is, in the same manner as the positioning members 30 press the side surfaces of the leads 35b for positional correction, the positioning members 45 press the side surfaces of the IC package body 35a for positional correction immediately before the contacting portions 20 are brought into contact with the leads 35b. The pair of positioning members 45 are spaced apart from each other somewhat greater than the width of the IC package body 35a, so that selected one of the positioning members 45 always acts on a side surface of the IC package body 35a for the above-mentioned correct positioning.

Figure 10:
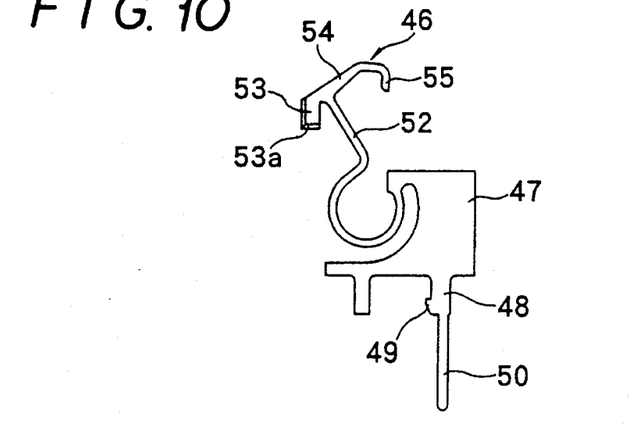
FIG. 10 is a side view showing a positioning member according to a third embodiment of the present invention.
Figure 11:
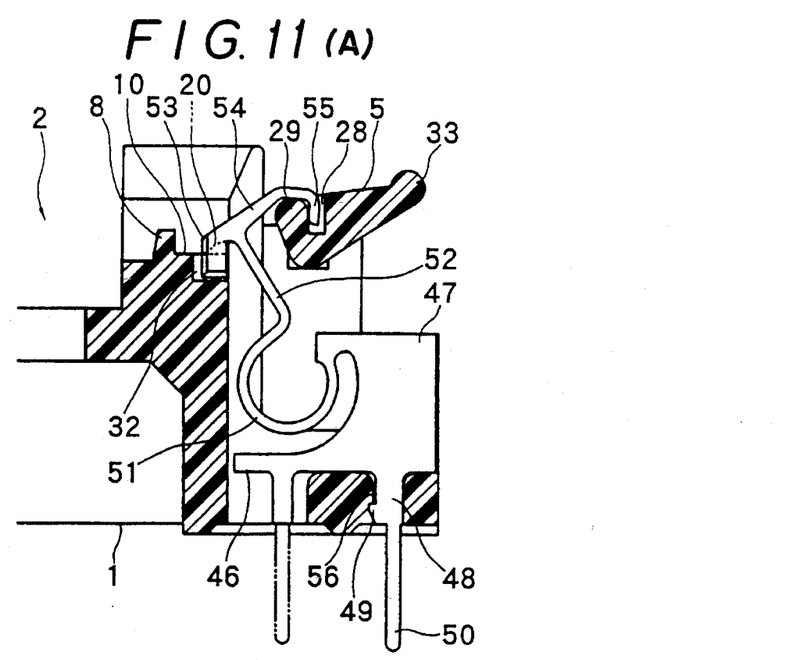
FIGS. 11(A) and 11(B) are cross-sectional views of an IC socket showing the action of the positioning member according to the third embodiment of the present invention, FIG. 11(A) showing a state in which the contact shutter lever has been turned upwardly and FIG. 11(B) showing a state in which the contact shutter lever has been turned downwardly.
Figure 12:
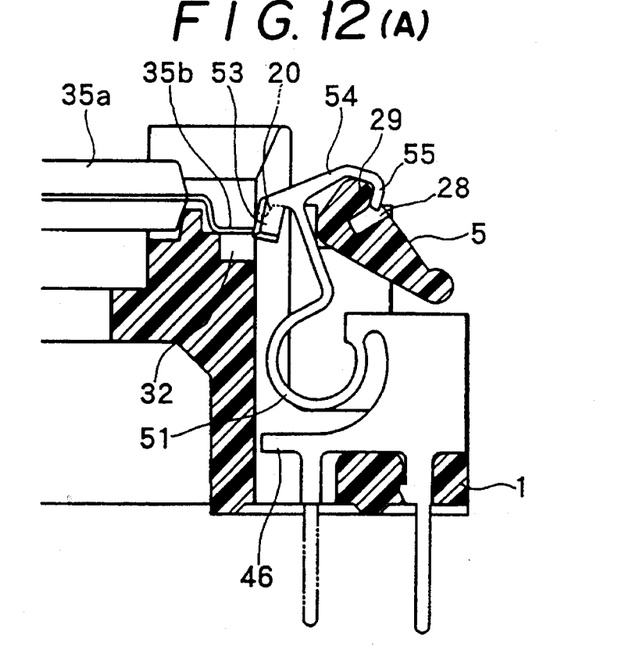
FIGS. 12(A) and 12(B) are cross-sectional views of the IC socket showing the action of the positioning member according to the third embodiment of the present invention, FIG. 12(A) showing a state in which the IC package has been received in the IC receiving portion, and FIG. 12(B) showing a state in which the lead of the IC package has been correctly positioned by the positioning member.

FIGS. 10 to 12 show a third embodiment of the present invention, in which a positioning member 46 is formed separately from the contact shutter levers 5 and the contact shutter cover 40. The positioning member 46 is designed in such a manner as to have a configuration similar to the contact member 3 and is implanted in parallel relation to the contact member 3 which is implanted in the contact implanting portion 4. Specifically, the positioning member 46 has a support plate portion 47 similar to the support plate portion 13 of the contact member 3. For implanting, as shown in FIG. 11(A), a press-in portion 48 projecting downwardly from a rear end side of the support plate portion 47 is press-fitted into a similar press-in hole 56 to the above-mentioned contact press-in hole 15, and an engagement claw 49 projecting forwardly from the press-in portion 48 is caused to bite into a wall surface of the press-in hole 56. A terminal portion 50, which projects downwardly of the socket body 1 from the press-in portion 48, is either inserted into a relief hole formed in a wiring board, or cut off, if unnecessary.

The positioning member 46 has a curved spring portion 51 projecting forwardly from an upper part of the support plate portion 47 and having a generally three-quarter arcuate configuration. The positioning member 46 further has an arm portion 52 extending linearly and obliquely upwardly from an upper end of the curved spring portion 51. The upper end of the arm portion 52 extends upwardly to above the level of the lead support surface 10. The positioning member 46 further has a positioning element portion 53 extending forwardly and downwardly from the upper end of the arm portion 52, a knife edge 53a formed from a front edge portion of the positioning element portion 53 to a lower edge portion thereof, a cantilever arm portion 54 projecting backwardly and obliquely upwardly from the positioning element portion 53, and a hook portion 55 bent downwardly from a rear end of the cantilever arm portion 54. By inserting the hook portion 55 into the engagement groove 28 of the contact shutter lever 5 of FIG. 11(A), the same is engaged with the operation portion 29.

As shown in FIG. 11(B), when the pressure receiving portion 33 of the contact shutter lever 5 is pressed down, the arm portions 21 and 54 are drawn by the operation portion 29, so that the contact member 3 and the positioning member 46 are moved backwardly and obliquely upwardly against the resiliency of the curved spring portions 18 and 51 and displaced into the standby position.

In the above condition, as shown in FIG. 12(A), when the IC package 35 is received in the IC receiving portion 2 and then the press-down force against the contact shutter lever 5 is removed, the contact shutter lever 5 is turned upwardly as shown in FIG. 12(B) due to the restoring resiliency of the curved spring portions 18 and 51 of the contact member 3 and the positioning member 46. In response to this upward turning movement of the contact shutter lever 5, the contacting portion 20 and the positioning element portion 53 are turned downwardly, so that the positioning element portion 53 is interposed between the adjacent leads 35b to press the side surfaces of the leads so as to correctly position the leads 35b relative to corresponding contact members 3. At the same time with this lead positioning operation or after the completion of the positioning operation, the contacting portion 20 of the contact member 3 is brought into press contact with the lead 35b.

The positioning member 46 may also be manufactured from an insulating material or metal material. In case a metal positioning member 46 is implanted between the adjacent contact members 3, at least one surface of the positioning element portions 53 is preferably coated with an insulating material, so that the positioning member 46 can be prevented from being short-circuited with the adjacent contact members 3.

Figure 13:
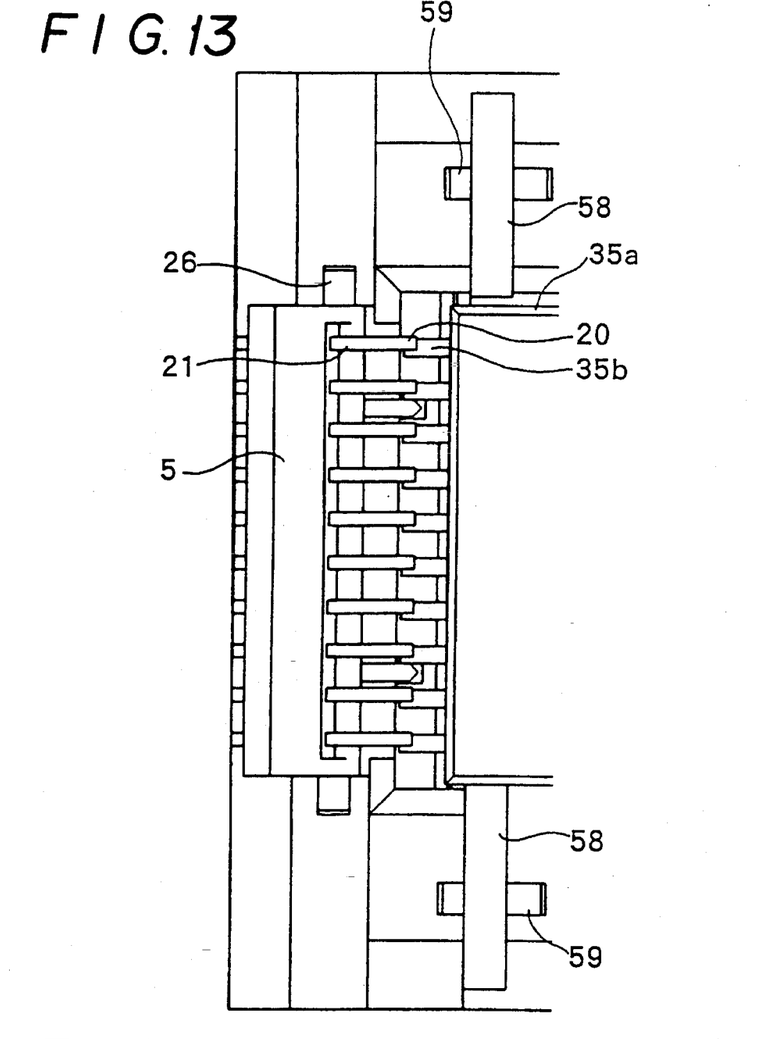
FIG. 13 is a plan view of an IC socket in which a positioning member according to a fourth embodiment of the present invention has correctly positioned the IC package and as a result, the contact members are in contact with the leads.

FIG. 13 shows a fourth embodiment of the present invention. The socket body 1 is provided with positioning members 58, which are operated simultaneously with the contact shutter lever 5 and are vertically turnably (pivotally) mounted on opposite side walls of the socket body through shafts 59, so that selected one of the positioning members 58 presses either one of the opposite side surfaces of the IC package body 35*a* in order to correctly position the contact member 3 relative to the lead 35*b* before the contacting portion 20 of the contact member 3 is brought into contact with the lead 35*b* of the IC package 35 which has already been received in the IC receiving portion 2. One or two pairs of such positioning members 58 are provided in such a manner as to be directed toward opposite side surfaces of the IC package body 35*a*, so that the opposite side surfaces of the IC package body are restricted by the foremost ends of the positioning members.

By pressing down rear end portions of the positioning members 58 using the contact shutter cover 40 or the like, together with the above-mentioned contact shutter levers 5, the distal end portions of the positioning members 58 and the contacting portion 20 of the contact member 3 are turned upwardly into the standby position. In that condition, when the press-down force against the cover 40 is removed after the IC package 35 is received in the IC receiving portion 2, the contacting portion 20 and the foremost end portions of the positioning members 58 are turned downwardly, so that either of the opposite side surfaces of the IC package 35*a* is pressed by the foremost end portions of the positioning members 58 in order to correctly position the lead 35*b* relative to the contact member 3 before the contact portion 20 is brought into contact with the lead 35*b*.

Figure 14:
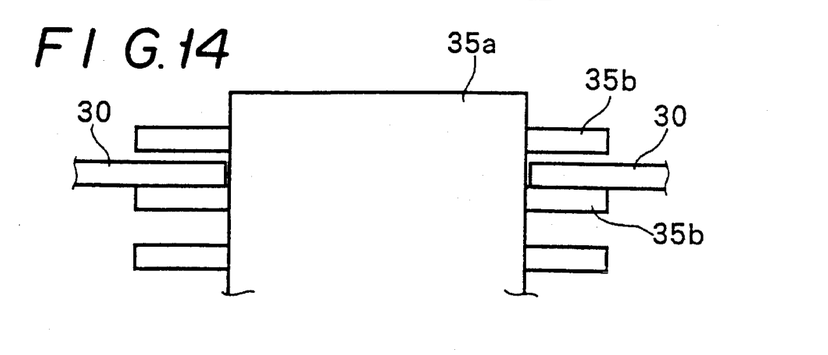
FIG. 14 is a plan view of the IC package and the positioning member according to another example of the present invention, in which the IC package is being correctly positioned by the positioning member.

As shown in FIG. 14, the present invention may be designed such that the foremost ends of the positioning members 30 or positioning element portions 53 extend proximate to the side surfaces of the IC package body 35*a* so that the side surfaces of the IC package body 35*a* are restricted by the end faces of the positioning members 30 or the positioning piece portions 53. In this case, the ribs 8 may be omitted. It is also possible that the IC package body 35*a* is roughly positioned by the ribs and then more precisely positioned by the positioning members 30 or positioning element portions 53.

The present invention also includes a case in which the side surfaces on the end sides of the lead array of the IC package body 35*a* are restricted by the side walls 36 standing up from the ends of the array of the contact members 3, i.e., the ends of the lead support surface 10 in order to roughly position the leads in the lead array direction, and then the IC package body 35*a* and the leads 35*b* are more precisely positioned in the array direction by the positioning members 30 or the positioning element portions 53.

The present invention also includes a case in which the contact shutter levers and the contact shutter cover are not provided, and contact members and the positioning members are opened and closed directly by an automatic machine or the like.

As described in the foregoing, according to the present invention, in an IC socket comprising a contact shutter member for displacing a contact member between a position where the contact member is in contact with a corresponding lead and a releasing position, positioning members are operated by being operatively connected to the contact shutter member to restrict the IC package body or the lead at the same time or before the contact member is brought into contact with the corresponding lead, thereby properly positioning the lead relative to the contact member. As a result, a reliable contacting condition between the contact member and the lead can be obtained positively.

The present invention is of course not limited to the above embodiments but many modifications can be made.

What is claimed is:

1. An IC socket comprising:

a substantially horizontally disposed socket body having an IC receiving portion for receiving a substantially horizontally disposed IC package;

a plurality of contact members arranged along said IC receiving portion of said socket body, each of said contact members having an IC lead contacting portion movably between an IC lead contacting position and an IC lead releasing position;

a contact shutter member movably mounted to said socket body and operably connected to said contact members for moving said IC lead contacting portions between said IC lead contacting positions and said IC lead releasing positions;

a positioning member, separate from said IC lead contacting portions of said contact members and operably connected with said contact shutter member for movement with said contact shutter member, for carrying out, upon movement of said contact shutter member, an IC lead positioning operation to horizontally move misaligned IC leads of an IC package disposed in said IC receiving portion into alignment with said IC lead contacting portions, in such a manner that said IC lead positioning operation is carried out simultaneously with or prior to said IC lead contacting portions being moved into said IC lead contacting positions by said contact shutter member.

2. An IC socket as recited in claim 1, wherein said positioning member is operable to carry out said IC lead positioning operation by pressing against side surfaces of the IC leads.

3. An IC socket as recited in claim 1, wherein said positioning member is mounted on said contact shutter member.

4. An IC socket as recited in claim 1, wherein said positioning member comprises a plurality of elongated positioning elements having base ends fixedly mounted to said contact shutter member and free ends extending therefrom inwardly toward said IC receiving portion of said socket body.

5. An IC socket as recited in claim 4, wherein said free ends of said elongated positioning elements are respectively disposed between neighboring pairs of said IC lead contacting portions of said contact members.

6. An IC socket as recited in claim 5, wherein said free ends of said positioning elements are provided with knife edges, respectively.

7. An IC socket as recited in claim 1, wherein said positioning member is operable to carry out said IC lead positioning operation by pressing against side surfaces of an IC body of the IC package.

8. An IC socket as recited in claim 1, wherein said shutter member has an engagement groove formed therein;

each of said contact members comprises a spring portion connected to said IC lead contacting portion and biasing said IC lead contacting portion inwardly toward said IC lead contacting position, and a hook portion connected to said IC lead contacting portion and engaged in said engagement groove of said shutter member; and said positioning member comprises a positioning element portion disposed between a neighboring pair of said IC lead contacting portions, a spring portion connected to said positioning element portion and biasing said positioning element portion inwardly, and a hook portion connected to said positioning element portion and engaged in said engagement groove of said shutter member.

9. An IC socket as recited in claim 1, wherein said positioning member comprises positioning elements pivotally mounted to said socket body and having free ends adapted to press against an IC body of the IC package when the IC package is mounted in said IC receiving portion.

10. An IC socket for use with an IC package having an IC body and IC leads projecting therefrom, said IC socket comprising:

a socket body having an IC body receiving surface and an IC lead supporting surface located about a periphery of said IC body receiving surface;

a plurality of contact members mounted to said socket body outwardly of said IC lead supporting surface, each of said contact members having an IC lead contacting portion movable between an IC lead contacting position in which said IC lead contacting portion presses against said IC lead supporting surface, and an IC lead releasing position spaced upwardly and outwardly from said IC lead contacting position;

a contact shutter member pivotally mounted to said socket body outwardly of said IC lead supporting surface, said contact shutter member being connected to said contact members; and an IC lead-positioning member mounted to and fixed for pivotal movement with said contact shutter member and extending inwardly from maid contact shutter member toward said IC lead supporting surface, said IC lead-positioning member having a free end disposed between a neighboring pair of said IC contacting portions to move misaligned IC leads of an IC package disposed on said IC body receiving surface into alignment with said IC lead contacting portions.

11. An IC socket as recited in claim 10, wherein said IC lead-positioning member is movable between a lowered position, in which it is disposed between the leads of an IC package when an IC package is present on said IC receiving surface, and a raised position; and said contact shutter member is operable to move said IC lead-positioning member into said lowered position simultaneously with or prior to said IC lead contacting portions being moved into said IC lead contacting positions, and to move said IC lead-positioning member into said raised position upon said IC lead contacting portions being moved into said IC lead releasing positions.

* * * * *